(12) United States Patent
Bertin et al.

(10) Patent No.: US 11,079,413 B2
(45) Date of Patent: Aug. 3, 2021

(54) METHODS AND RELATED SYSTEMS OF A READOUT CIRCUIT FOR USE WITH A WHEATSTONE BRIDGE SENSOR

(71) Applicant: SEMICONDUCTOR COMPONENTS INDUSTRIES, LLC, Phoenix, AZ (US)

(72) Inventors: Jacques Jean Bertin, Pocatello, ID (US); Johan Camiel Julia Janssens, Asse (BE); Sam Jan Ben Willem Vermeir, Hofstade (BE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 130 days.

(21) Appl. No.: 15/856,334

(22) Filed: Dec. 28, 2017

(65) Prior Publication Data
US 2019/0204365 A1 Jul. 4, 2019

(51) Int. Cl.
| | | |
|---|---|---|
| *G01R 17/06* | (2006.01) | |
| *G01L 1/22* | (2006.01) | |
| *G01K 7/16* | (2006.01) | |
| *G01R 19/25* | (2006.01) | |
| *G01K 7/20* | (2006.01) | |

(52) U.S. Cl.
CPC .......... *G01R 17/06* (2013.01); *G01K 7/16* (2013.01); *G01K 7/206* (2013.01); *G01L 1/2262* (2013.01); *G01R 19/2506* (2013.01)

(58) Field of Classification Search
CPC ..... G01R 19/2506; G01L 1/2262; G01K 7/16
See application file for complete search history.

(56) References Cited

U.S. PATENT DOCUMENTS

| | | | | |
|---|---|---|---|---|
| H1793 H | * | 4/1999 | Peterson | 323/367 |
| 7,278,319 B2 | * | 10/2007 | Johnson | G01L 9/0054 73/721 |
| 8,179,121 B2 | | 5/2012 | Hynd et al. | |
| 9,509,332 B1 | * | 11/2016 | Garrity | H03M 3/468 |
| 2005/0194980 A1 | | 9/2005 | Konig et al. | |
| 2006/0250146 A1 | * | 11/2006 | Braun | G01L 1/2281 324/720 |
| 2007/0113665 A1 | * | 5/2007 | Johnson | G01L 9/0054 73/721 |
| 2007/0152509 A1 | * | 7/2007 | Bucher | H03F 3/387 307/119 |

(Continued)

*Primary Examiner* — Alvaro E Fortich
(74) *Attorney, Agent, or Firm* — Dickinson Wright PLLC; Mark E. Scott

(57) ABSTRACT

A readout circuit for use with a Wheatstone bridge sensor. At least some of the example embodiments are methods including: driving an excitation signal in parallel through a first set of sensor elements of a Wheatstone bridge sensor and refraining from driving the excitation signal through a second set of sensor elements of the Wheatstone bridge sensor; measuring response of the first set of sensor elements, the measuring response of the first set of sensor elements creates a first measurement; and then driving the excitation signal in parallel through the second set of sensor elements of the Wheatstone bridge and refraining from driving the excitation signal through the first set of sensor elements; and measuring response of the second set of sensor elements, the measuring response of the second set of sensor elements creates a second measurement.

20 Claims, 9 Drawing Sheets

(56) References Cited

U.S. PATENT DOCUMENTS

| | | | |
|---|---|---|---|
| 2008/0011064 A1 | 1/2008 | Masser et al. | |
| 2008/0116886 A1* | 5/2008 | Yamada | G01D 5/145 |
| | | | 324/207.21 |
| 2010/0053789 A1* | 3/2010 | Duric | B82Y 25/00 |
| | | | 360/31 |
| 2010/0244813 A1* | 9/2010 | Hynd | G01P 15/0802 |
| | | | 324/101 |
| 2011/0146410 A1* | 6/2011 | Hammerschmidt | G01L 9/06 |
| | | | 73/718 |
| 2013/0093431 A1* | 4/2013 | Raman | G01L 1/144 |
| | | | 324/537 |
| 2013/0211767 A1* | 8/2013 | Frolov | G01F 1/698 |
| | | | 702/100 |
| 2015/0293155 A1* | 10/2015 | Joet | G01R 19/0084 |
| | | | 324/706 |
| 2016/0061863 A1* | 3/2016 | Zhang | G01R 33/123 |
| | | | 324/126 |
| 2016/0123828 A1* | 5/2016 | Matzen | G01L 9/0055 |
| | | | 73/723 |
| 2016/0178403 A1* | 6/2016 | Bilger | G01D 5/24461 |
| | | | 324/207.21 |
| 2017/0074915 A1 | 3/2017 | Raman et al. | |

* cited by examiner

METHODS AND RELATED SYSTEMS OF A READOUT CIRCUIT FOR USE WITH A WHEATSTONE BRIDGE SENSOR

CROSS-REFERENCE TO RELATED APPLICATIONS

None.

BACKGROUND

Many available industrial sensors (e.g., pressure sensors, temperature sensors) are provided in a Wheatstone-based bridge format. Wheatstone-based sensors have four impedance elements: two impedance elements respond with increasing impedance as a measured parameter increases, and two impedance elements respond with decreasing impedance as the measured parameter increases. In the related art, the Wheatstone-based sensor is provided a driving voltage or current through the entire bridge, and the voltage or current measured in the middle of the bridge is representative of the measured parameter.

Some measurement systems need to comply with functional safety requirements, such as brake fluid pressure measurements in automobiles as set forth by the International Standards Organization (ISO) Standard 26262. Functional safety requirements may dictate that the measurement circuitry detect faults, errors, and/or failure in the Wheatstone-based sensors (among others sensors and systems). Any system and related method that can reduce the complexity and cost of detecting faults, errors, and/or failures of a Wheatstone-based sensor may provide a competitive advantage in the marketplace.

SUMMARY

Various embodiments are directed to methods and related systems of a readout circuit for use with a Wheatstone bridge sensor (e.g., pressure sensor, temperature sensor). One example method comprises: driving an excitation signal in parallel through a first set of sensor elements of a Wheatstone bridge sensor and refraining from driving the excitation signal through a second set of sensor elements of the Wheatstone bridge sensor; measuring response of the first set of sensor elements, the measuring response of the first set of sensor elements creates a first measurement; and then driving the excitation signal in parallel through the second set of sensor elements of the Wheatstone bridge and refraining from driving the excitation signal through the first set of sensor elements; and measuring response of the second set of sensor elements, the measuring response of the second set of sensor elements creates a second measurement.

The example method may further comprise detecting failure of a sensor element of the first set of sensor elements based on the first measurement and the second measurement.

Measuring the response of the first set of sensor elements in the example method may further comprise measuring an analog signal across a first port and a second port of the Wheatstone bridge sensor; and measuring the response of the second set of sensor elements in the example method further comprises measuring an analog signal across the first port and the second port of the Wheatstone bridge sensor.

Driving the excitation signal in parallel through the first set of sensor elements and refraining from driving the excitation signal through the second set of sensor elements in the example methods may further comprise: driving an electrical current to a third port of the Wheatstone bridge sensor; and electrically floating a fourth port of the Wheatstone bridge sensor. Driving the excitation signal in parallel through the second set of sensor elements and refraining from driving the excitation signal through the first set of sensor elements in the example methods may further comprise: driving the electrical current to the forth port of the Wheatstone bridge sensor; and electrically floating the third port of the Wheatstone bridge sensor.

Measuring the response of the first set of sensor elements in the example methods may further comprise: controlling voltage across the first port and second port such that the voltage across the first port and second port is substantially zero, the controlling by applying a balancing current to the first port and second port; and determining the first measurement based on the balancing current.

Controlling voltage across first port and second port of the Wheatstone bridge sensor in the example method may further comprise applying the balancing current by way of a digital-to-analog (D/A) converter electrically coupled to the first port and second port. The example method may further comprise creating a digital representation of the first measurement by: reading, by an analog-to-digital (A/D) converter, an output signal from a differential amplifier electrically coupled to the first and second port of the Wheatstone bridge sensor, the reading creates a digital value; supplying the digital value to the D/A converter; and creating the digital representation by averaging the digital value over a predetermined amount of time.

Reading the output signal and supplying the digital value to the D/A converter in the example method may further comprise reading and supplying by way of a one-bit Sigma-delta A/D modulator. Applying the balancing current in the example method may further comprise applying the balancing current directly to the first port and second port of the Wheatstone bridge sensor. Applying the balancing current in the example method may further comprise applying the balancing current directly to differential outputs of a differential amplifier whose inverting and non-inverting inputs are coupled to the first and second ports of the Wheatstone bridge sensor.

Measuring the response of the second set of sensor elements in the example method may further comprise: controlling voltage across the first port and second port such that the voltage across the first port and second port is substantially zero, the controlling by applying the balancing current to the first port and second port; and determining the second measurement based on the balancing current.

Other example embodiments may be a sensor circuit comprising: a first, second, third, and fourth sensor connections, the first, second, third, and fourth sensor connections configured to couple to a first, second, third, and fourth ports of a Wheatstone bridge sensor; a switch network coupled to the third and fourth sensor connections, in a first mode the switch network couples a current source to the third sensor connection and electrically floats the fourth sensor connection, and in a second mode couples a current source to the fourth sensor connection and electrically floats the third sensor connection; a differential amplifier that defines a first differential input, a second differential input, and a differential output, the first and second sensor connections electrically coupled to the first and second differential inputs, respectively; an analog-to-digital (A/D) converter that defines an analog input and a digital output, the analog input electrically coupled to the differential output of the differential amplifier; a digital-to-analog (D/A) converter that defines a digital input and an analog output, the digital input electrically coupled to the digital output of the A/D converter, and the analog output coupled to the first and second sensor connections; a decimator coupled to the digital output of the A/D converter, the decimator configured to create measurement values based on values read from the digital output of the A/D converter; and wherein, in the first mode the sensor circuit is configured to make a first measurement of the first set of sensors in the Wheatstone bridge circuit, and in the second mode the sensor circuit is configured to make a second measurement of a second set of sensors in the Wheatstone bridge sensor.

The switch network of the example sensor circuit may further comprise an electrical switch that defines a common terminal, a first terminal, and a second terminal, the common terminal coupled to a current source, the first terminal coupled to the third sensor connection, and the second terminal coupled to the fourth sensor connection, in the first mode the electrical switch couples the third sensor connection to the current source and electrically floats the fourth sensor connection, and in the second mode the electrical switch electrically floats the third sensor connection and couples the first current source to the fourth sensor connection.

The differential amplifier in the example sensor circuit may further comprise an operational transconductance amplifier (OTA). The analog output of the D/A converter in an example sensor circuit may be directly coupled to the differential output of the OTA.

The differential amplifier in the example sensor circuit may further comprise an operational transconductance amplifier (OTA). The analog output of the D/A converter in an example sensor circuit may be directly coupled to the differential input of the OTA.

The differential amplifier in an example sensor circuit may further comprise: a differential amplifier that defines the first and second differential inputs, and the differential amplifier defines a first and second differential outputs; a first capacitor coupled between the first differential output and the first differential input; a second capacitor coupled between the second differential output and the second differential input; wherein the analog output of the D/A converter is directly coupled to the first and second differential inputs. The A/D converter may be sigma-delta A/D converter. The sigma-delta A/D converter may be a one-bit sigma-delta A/D converter.

The switch network in an example sensor circuit may further comprise: a first switch that defines a common terminal, a first terminal, and a second terminal, the common terminal of the first switch electrically coupled to a first current source, the first terminal of the first switch electrically coupled to the third sensor connection, and the second terminal of the first switch electrically coupled to the first sensor connection; a second switch that defines a common terminal, a first terminal, and a second terminal, the common terminal of the second switch electrically coupled to a second current source, the first terminal of the second switch electrically coupled to the third sensor connection, and the second terminal of the second switch electrically coupled to the second sensor connection; a third switch that defines a common terminal, a first terminal, and a second terminal, the common terminal of the third switch electrically coupled to a third current source, the first terminal of the third switch electrically coupled to the fourth sensor connection, and the second terminal of the third switch electrically coupled to the first sensor connection; a fourth switch that defines a common terminal, a first terminal, and a second terminal, the common terminal of the fourth switch electrically coupled to a fourth current source, the first terminal of the second switch electrically coupled to the fourth sensor connection, and the second terminal of the fourth switch electrically coupled to the second sensor connection; wherein the first mode the first and second current sources are electrically coupled to the third sensor connection, the third current source is electrically coupled to the first sensor connection, the fourth current source is electrically coupled to the second sensor connection, and the fourth sensor connection is electrically floated; and wherein the second mode the third and fourth current sources are electrically coupled to the fourth sensor connection, the first current source is electrically coupled to the first sensor connection, the second current source is electrically coupled to the second sensor connection, and the third sensor connection is electrically floated. In an example sensor circuit, the analog output of the D/A converter is directly coupled to the differential input of the differential amplifier. An example sensor circuit may further comprise a Wheatstone bridge sensor, the first, second, third, and fourth ports of the Wheatstone bridge sensor coupled to the first, second, third and fourth sensor connections, respectively.

BRIEF DESCRIPTION OF THE DRAWINGS

For a detailed description of example embodiments, reference will now be made to the accompanying drawings in which.

DEFINITIONS

Figure 1:
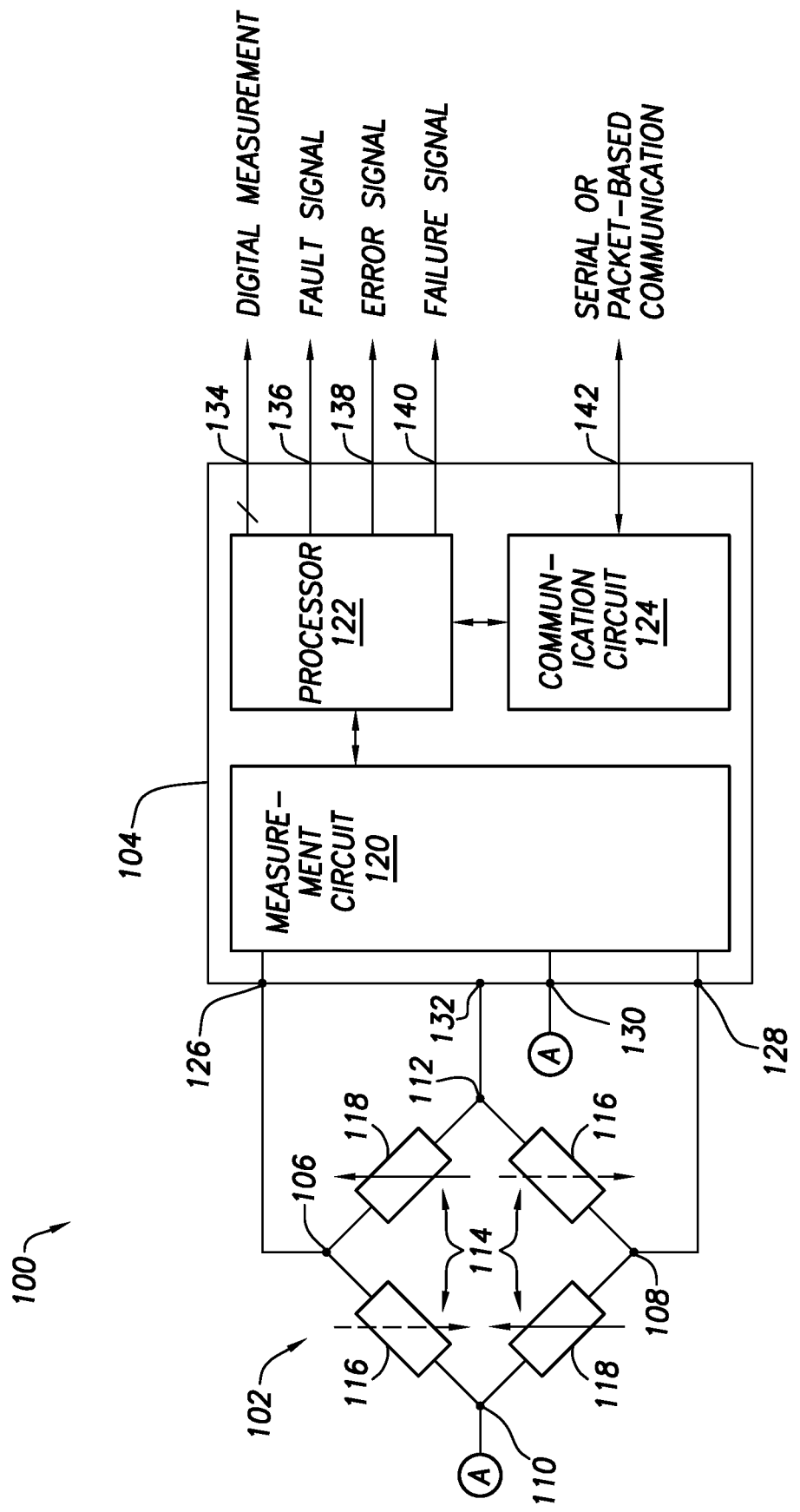
FIG. 1 shows a block diagram of a readout system, including a Wheatstone bridge sensor, in accordance with at least some embodiments.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"Wheatstone bridge sensor" shall mean an electrical circuit configured to be responsive to a physical parameter (e.g., pressure, temperature) where the Wheatstone bridge sensor has four sensor elements whose impedance changes responsive to the physical parameter.

"Impedance" refers to an electrical property that may have a component that is not frequency dependent and a component that is frequency dependent. Thus, a change in an electrical property that is not frequency dependent (e.g., resistance) shall nevertheless be considered a change in impedance.

"Set of sensor elements" shall mean two sensor elements of a Wheatstone bridge sensor; the two sensor elements electrically in parallel.

"Substantially zero" in reference to a voltage across two ports of a Wheatstone bridge sensor shall mean that the voltage across the two ports is 0.1 volts or less. Momentary non-zero voltages as a system attempts to again bring the voltage to zero across the two ports shall not obviate the status of the voltage across the two ports as substantially zero.

In relation to electrical devices, the terms "input" and "output" refer to electrical connections to the electrical devices, and shall not be read as verbs requiring action. For example, a differential amplifier (such as an operational amplifier) may have a first differential input and a second differential input, and these "inputs" define electrical connections to the operational amplifier, and shall not be read to require inputting signals to the operational amplifier.

Claim limitations about a device "in a first mode . . . , and in a second mode . . . " shall not be read to require that the modes are simultaneously present.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various embodiments are directed to methods and related systems of a readout circuit for use with a Wheatstone bridge sensor (e.g., pressure sensor, temperature sensor). In accordance with at least some embodiments, a first set of sensor elements of the Wheatstone bridge sensor is measured while the effect of the second set of sensor elements is substantially removed or attenuated by electrically floating the port of the Wheatstone bridge sensor between the second set of sensor elements. Thereafter, the second set of sensor elements is measured while the effect of the first set of sensor elements is substantially removed or attenuated by electrically floating the port of the Wheatstone bridge sensor between the first set of sensor elements. Based on differences in the measured parameter as between the first and second sets of sensor elements, not only can the measured parameter be determined, but also faults within the Wheatstone bridge sensor may be detected and reported. Moreover, for the measurement associated with any particular set of sensor elements, various embodiments are directed to a measurement method and system that creates a digital representation of the measured parameter by driving an excitation signal through the set of sensor elements by way of one port of the Wheatstone bridge sensor, and applying a balancing current at the measurement ports such that the voltage downstream of the set of sensor elements is substantially zero (a "virtual short"). The measurement is then based on the balancing current used to impose the substantially zero voltage condition. The discussion first turns to a high level overview of sensor systems to orient the reader.

FIG. 1 shows a block diagram of a readout system, including a Wheatstone bridge sensor, in accordance with at least some embodiments. In particular, FIG. 1 shows readout system 100 which comprises a Wheatstone bridge sensor 102 coupled to a readout circuit 104. The Wheatstone bridge sensor 102 defines four sensor ports, including a first port 106, second port 108, third port 110, and fourth port 112. The Wheatstone bridge sensor 102 comprises four sensor elements 114, and each sensor element has an electrical property that changes in response to the measured physical parameter (e.g., pressure, temperature). For example, two sensor elements respond with decreasing impedance as the measured parameter increases (e.g., sensor elements 116, shown with dashed downward pointing arrows), and two sensor elements respond with increasing impedance as the measured parameter increases (e.g., sensor elements 118, shown with solid upward pointing arrows). Within manufacturing tolerances, the sensor elements 116 are matched, and the sensor elements 118 are matched. The sensor elements 114 are coupled circularly, end-to-end, such that the electrical connections between the sensor elements 114 define the first through fourth ports as shown. The Wheatstone bridge sensor 102 may be any currently available or after-developed Wheatstone-based sensor.

The example readout circuit 104 comprises a measurement circuit 120 coupled to a processor 122, and in some cases a communication circuit 124. The measurement circuit 120, and thus the readout circuit 104, defines four sensor connections, including a first sensor connection 126, second sensor connection 128, third sensor connection 130, and fourth sensor connection 132. When coupled to a Wheatstone bridge sensor 102, the first sensor connection 126, second sensor connection 128, third sensor connection 130, and fourth sensor connection 132 are electrically coupled to the first port 106, second port 108, third port 110, and fourth port 112, respectively, of the Wheatstone bridge sensor 102. The measurement circuit 120 is configured to drive excitation signals to the Wheatstone bridge sensor 102, and to measure response of the sensors of the Wheatstone bridge sensor 102, as discussed in greater detail below. Suffice it to say at this stage of the description that the measurement circuit 120 communicatively provides two or more measurements of the sensor elements of the Wheatstone bridge sensor 102 to the processor 122.

Still referring to FIG. 1, the processor 122 may be any suitable set of circuits, such as a microprocessor executing software instructions, a field programmable gate array (FPGA), an application-specific integrated circuit (ASIC), or discrete components designed and implemented to perform specific tasks. The processor 122 receives the measurements regarding the sensor elements of the Wheatstone bridge sensor 102. Using the measurements received from the measurement circuit 120, the processor 122 may make a final determination as to the measured parameter, and pass an indication of the measured parameter to downstream devices in a multi-bit word format (as shown by the digital measurement output 134). Moreover, the processor 122 may analyze the measurements provided by the measurement circuit 120 and make functional safety determinations, such as the presence of fault, error, and/or failure of a portion or the entire Wheatstone bridge sensor 102. The processor 122 may communicate the determinations to downstream devices by way of Boolean output signals, such as signals driven over the fault output 136, error output 138, and/or failure output 140.

The example readout circuit 104 further comprises a communication circuit 124 communicatively coupled to the processor 122 (and thus the measurement circuit 120). The communication circuit 124, when present, is designed and constructed to provide serial and/or packet-based communication with downstream devices. Thus, in addition to or in place of the processor 122 providing digital measurements and functional safety determinations directly, the processor 122 may communicate the digital measurements and functional safety determinations via serial and/or packet-based communications with downstream devices, as shown by communication channel 142. In some example systems, the processor 122 and communication circuit 124 may be a combined device (e.g., ASIC). Moreover, in some systems the functional safety determinations may be made by downstream devices, and thus the processor 122 and/or communication circuit 124 may pass the raw measurements (e.g., response of a first set of sensor elements to an excitation signal, and response of a second set of sensor elements to an excitation signal) to downstream devices.

In some cases, the readout circuit 104 is sold as a standalone unit, either as an encapsulated semiconductor device in any of a number of form factors, or as an un-encapsulated semiconductor die, to be combined with other components (e.g., Wheatstone bridge sensor) by system-level device manufacturers. In other cases, the Wheatstone bridge sensor 102 and readout circuit 104 may be combined and sold as a standalone product (e.g., a pressure sensing system with functional safety determinations). The specification now turns to a more detailed description of isolating sets of sensor elements of the Wheatstone bridge sensor 102 for taking discrete measurements of each set of sensor elements.

Figure 2:
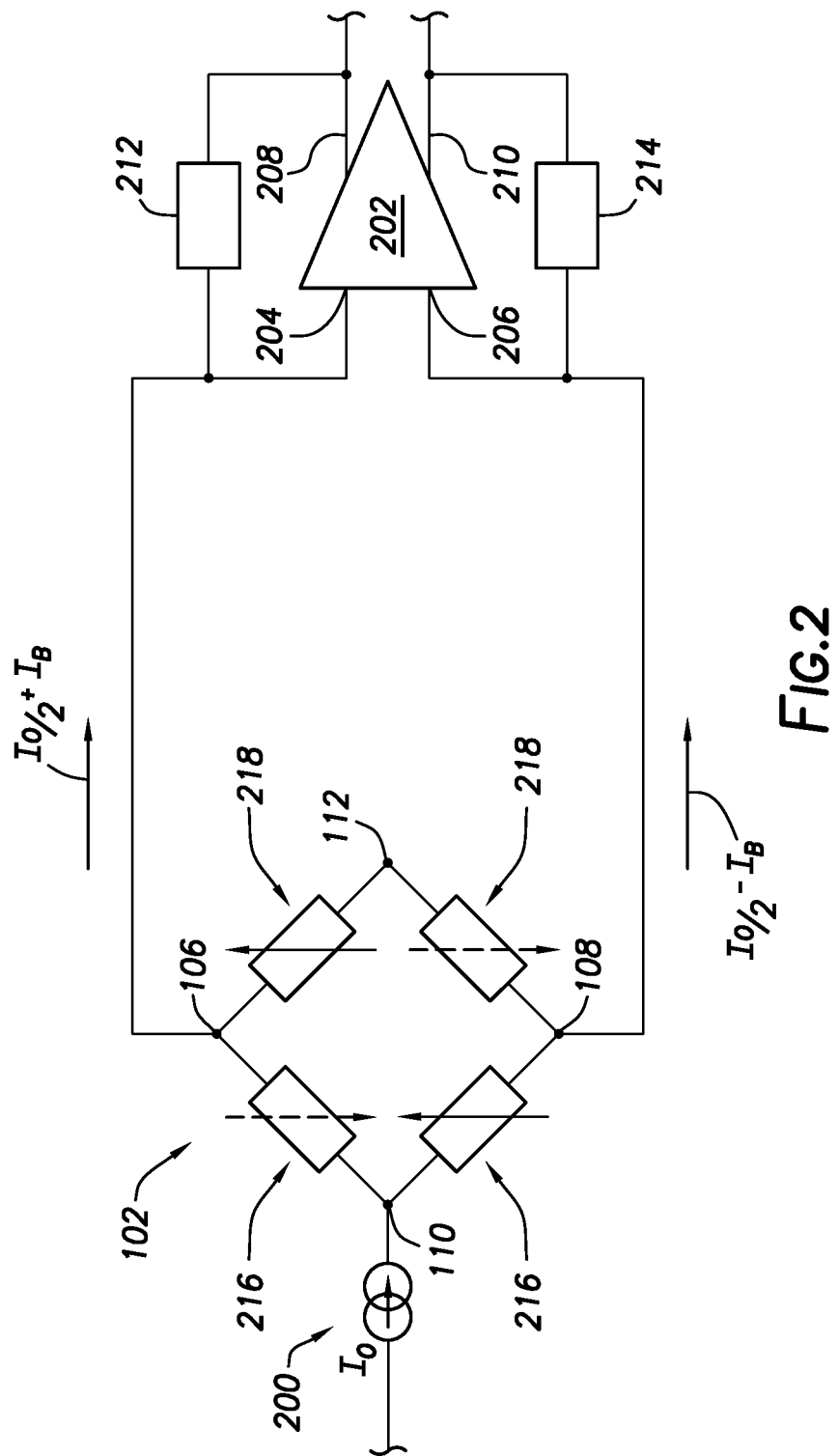
FIG. 2 shows an simplified circuit diagram in order to describe isolating a first set of sensor elements in accordance with at least some embodiments.

FIG. 2 shows a simplified circuit diagram in order to describe isolating sets of sensor elements in accordance with at least some embodiments. In particular, visible in FIG. 2 is the Wheatstone bridge sensor 102, an excitation source 200, and a differential amplifier 202. The excitation source 200 (e.g., a current source, or a voltage source) is electrically coupled to the third port 110 of the Wheatstone bridge sensor 102. The differential amplifier 202 defines a first differential input 204 that is electrically coupled to the first port 106 of the Wheatstone bridge sensor 102, and the differential amplifier 202 defines a second differential input 206 that is electrically coupled to the second port 108 of the Wheatstone bridge sensor 102. The differential amplifier 202 further defines a first differential output 208 and a second differential output 210. The first differential output 208 is electrically coupled to the first differential input 204 by way of a feedback element 212, and the second differential output 210 is electrically coupled to the second differential input 206 by way of a feedback element 214. For this part of the discussion, differential amplifier 202 will be assumed to be the device that makes each measurement of the sets of sensor elements of the Wheatstone bridge sensor 102; however, making measurements and creating digital representations of the measurements in accordance with further example embodiments are discussed in greater detail below.

FIG. 2 conceptually represents a first mode of the readout circuit 104 (FIG. 1) for measuring a first set of sensor elements 216 of the Wheatstone bridge sensor 102. In particular, in the example first mode the first port 106 and second port 108 of the Wheatstone bridge sensor 102 are electrically coupled to the differential amplifier 202, and the fourth port 112 is electrically floated. The excitation source 200 drives an excitation signal 10 into the third port 110, and thus drives the excitation signal in parallel through the first set of sensor elements 216. In the example first mode the system refrains from driving the excitation signal to the second set of sensor elements by, as shown, electrically floating the fourth port 112 and by creating a "virtual short" across the first port 106 and second port 108. In particular, the example system creates the virtual short by applying a balancing current $I_B$ to the first port 106 and second port 108 such that voltage across the first port 106 and second port 108 is substantially zero volts. Equivalently stated, the system applies the balancing current $I_B$ such that voltage on the first port 106 referenced to a ground or common, and the voltage on the second port 108 referenced to the ground or common, are substantially the same.

In the example system shown in FIG. 2, the balancing current is created and applied by way of the feedback paths associated with the differential amplifier 202. In particular, the voltages driven across the first differential output 208 and second differential output 210 creates electrical current flows through the feedback elements 212 and 214 that tend to force the voltage across the first differential input 204 and second differential input 206 to be substantially zero volts. Given the electrical connection of the first differential input 204 and the second differential input 206 to the first port 106 and second port 108, respectively, the combination of the differential amplifier 202 and its feedback paths create the virtual short across the first port 106 and second port 108 of the Wheatstone bridge sensor 102. The example differential amplifier 202 creates an output signal (driven across the two outputs) that is proportional to the balancing current $I_B$ used to create the virtual short, and thus proportional to the parameter measured by the first set of sensor elements 216 (e.g., a first measurement).

Figure 3:
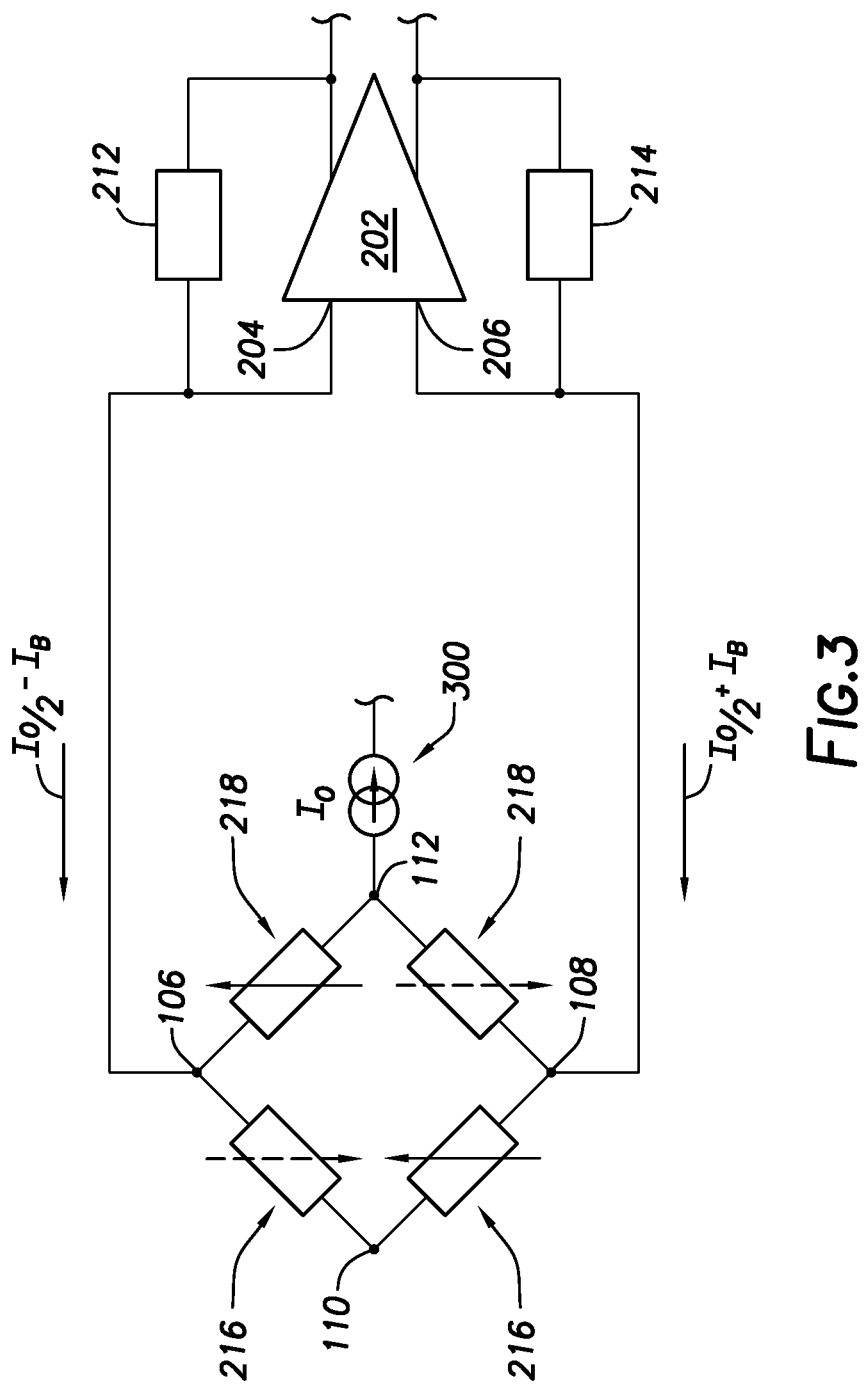
FIG. 3 shows a simplified circuit diagram in order to describe isolating a second set of sensor elements in accordance with at least some embodiments.

FIG. 3 shows a simplified circuit diagram in order to describe isolating sets of sensor elements in accordance with at least some embodiments. In particular, FIG. 3 is closely related to FIG. 2; however, in FIG. 3 the third port 110 of the Wheatstone bridge sensor 102 is electrically floated, and an excitation source 300 is electrically coupled to the fourth port 112. FIG. 3 represents a second mode of the readout circuit 104 (FIG. 1) for measuring a second set of sensor elements 218 of the Wheatstone bridge sensor 102. In the example second mode the first port 106 and second port 108 of the Wheatstone bridge sensor 102 remain electrically coupled to the differential amplifier 202. The excitation source 300 drives an excitation signal $I_O$ through the fourth port 112, and thus drives the excitation signal in parallel through the second set of sensor elements 218. In the example second mode the system refrains from driving the excitation signal to the first set of sensor elements by, as shown, electrically floating the third port 110 and by applying a balancing current $I_B$ to the first port 106 and second port 108 such that voltage across the first port 106 and second port 108 is substantially zero. As with respect to FIG. 2, the balancing current $I_B$ in FIG. 3 is created and applied by way of the feedback paths associated with the differential amplifier 202 and thus creates a "virtual short" across the first port 106 and second port 108 of the Wheatstone bridge sensor 102. The example differential amplifier 202 creates an output signal (driven across the two outputs) that is proportional to the balancing current $I_B$ used to create the virtual short, and thus proportional to the parameter measured by the second set of sensor elements 218 (e.g., a second measurement).

It follows that FIGS. 2 and 3 thus show methods and related systems of measuring physical parameters using a first set of sensors (to the exclusion of the second set of sensors), and then measuring the physical parameter using the second set of sensors (to the exclusion of the first set of sensors). Based on the two measurements, which should be very similar in error-free operation, the readout circuit 104 may produce a final measurement and pass the final measurement to downstream devices as discussed with respect to FIG. 1. Should a difference in the measurements be greater than a predetermined threshold, the readout circuit 104 may take appropriate corrective action, such as discarding a measurement from one of the sets of sensor elements where a fault has occurred (e.g., sensor elements electrically shorts, or electrically opens), utilize the measurement from the second set of sensor elements, and assert the appropriate fault, error, and/or failure output.

The example circuits of FIGS. 2 and 3 would be operational in circumstances where the differential amplifier 202 can operate taking into account common-mode voltage created by the excitation sources 200/300. However, in yet still other example embodiments the common-mode voltage may be reduced by addressing the excitation current on the first port 106 and second port 108 such that the feedback paths need only be concerned with the balancing current. Moreover, addressing the excitation current in this manner affects design of a switch network that enables sequentially creating the measurements situations of FIGS. 2 and 3. The switch network is discussed after a discussion of an example system to extract the excitation current.

Figure 4:
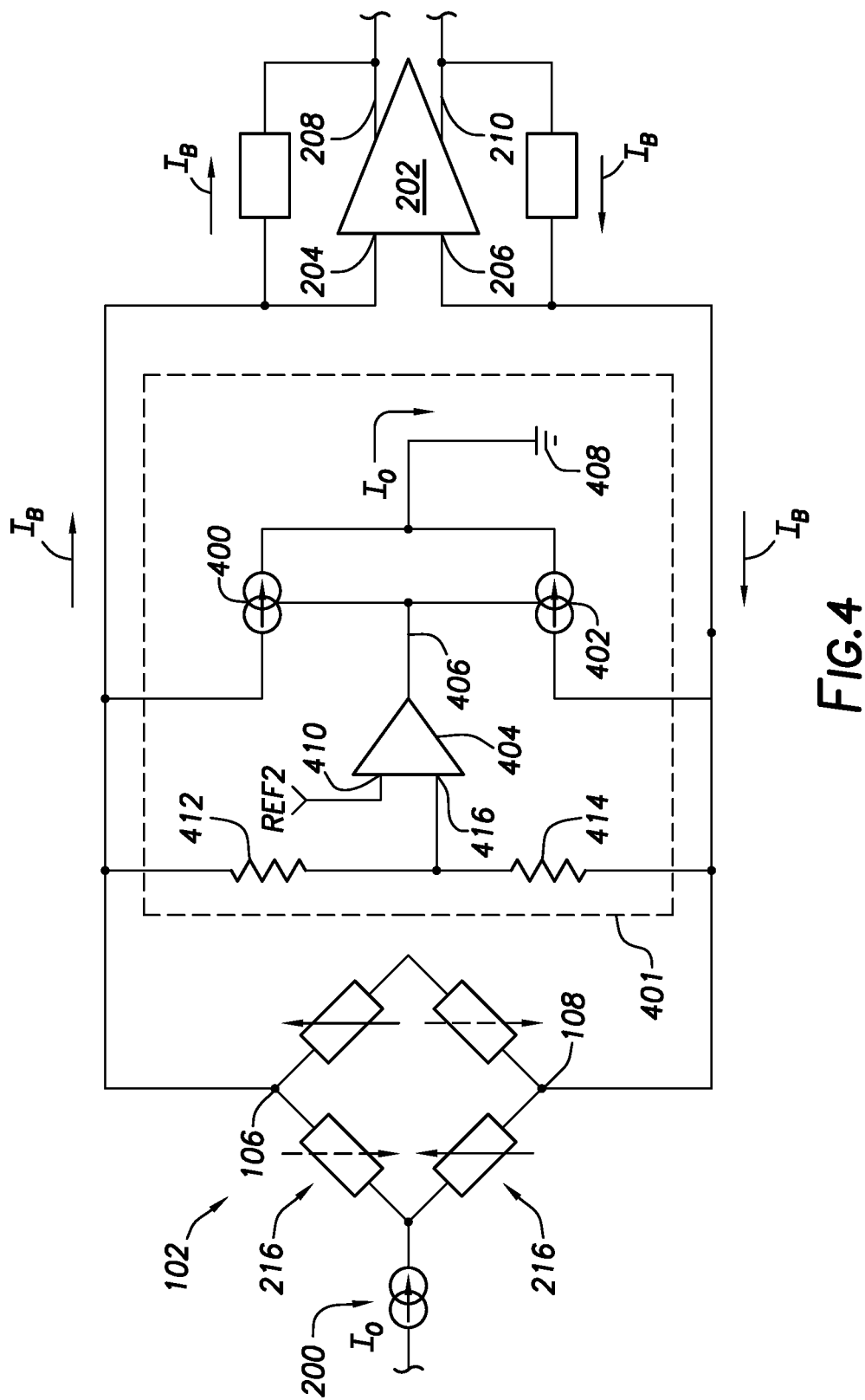
FIG. 4 shows a diagram of a circuit including a system to address excitation current at the first port and second port of the Wheatstone bridge sensor, in accordance with at least some embodiments.

FIG. 4 shows a circuit diagram including a system to address the excitation current on the first port 106 and second port 108 of the Wheatstone bridge sensor in accordance with at least some embodiments. In particular, FIG. 4 shows the example first mode described with respect to FIG. 2, and further including extraction circuit 401 to extract the excitation current $I_O$. In the example system of FIG. 4, the excitation source 200 drives the excitation signal $I_O$ in parallel through the first set of sensor elements 216. Taking into account the balancing current $I_B$ caused by the differential amplifier in this example, the excitation current divides itself with a first portion flowing through one sensor element, and a second portion flowing through the second sensor element of the first set of sensor elements such that the voltage across the first port 106 and second port 108 is substantially zero.

The extraction circuit 401 comprises a first current source 400, second current source 402, and an error amplifier 404. The first current source 400 couples on one side to the first port 106, and on a second side to common or ground 408. The second current source 402 couples on one side to the second port 108 and on a second side to the common or ground. The output of the error amplifier 404 couples to the first and second current sources 400/402 by way of a control line 406. By way of a control signal created by the error amplifier 404 and applied to the control line 406, the amplifier 404 controls the total current flow through the current sources 400/402. Within manufacturing tolerances, current flow through each current source 400/402 will be equal for an identically applied control signal, and the sum of the electrical currents through the current sources 400/402 is equal $I_O$ in steady state conditions (as illustrated by the $I_O$ flowing into the ground connection 408 in FIG. 4).

Figure 5:
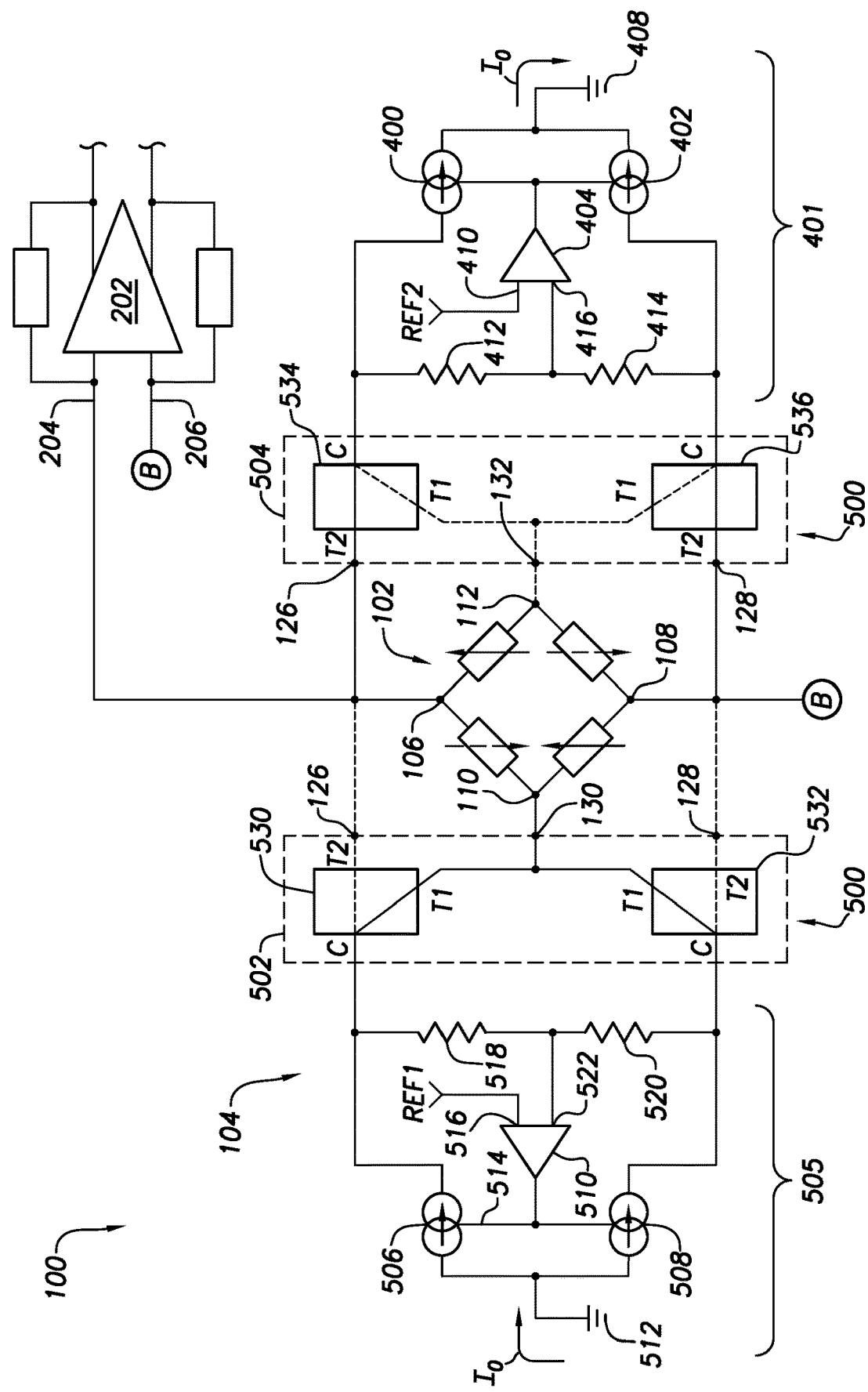
FIG. 5 shows a partial schematic, partial block diagram, view of a readout system 100 that comprises a switch network to implement the example modes, in accordance with at least some embodiments.

Still referring to FIG. 4, the control signal created by the error amplifier 404 is generated based on a difference between a reference voltage (designed "REF2" in the figure) coupled to one input 410 of the error amplifier, and a voltage from a voltage divider created by example resistors 412 and 414. That is, resistors 412 and 414 are coupled in series across the first port 106 and second port 108. The second input 416 of the error amplifier 404 is coupled between the resistors 412 and 414. The reference voltage REF2 may be set to the mid-point of the operational range of the circuit. For example, if the operational range is 3V, then the reference voltage REF may be set to 1.5V. In steady-state operation, the current sources 400/402 enable the excitation current to flow through the extraction circuit 401 (rather than through the feedback paths of the differential amplifier 202), which reduces or eliminates the common-mode voltage experienced by the differential amplifier 202. Moreover, the differential amplifier 202 need only supply/carry the balancing current $I_B$ to impose the virtual short across the first port 106 and second port 108. An extraction circuit to address excitation current in the example second mode is shown in FIG. 5 below, but the operation is conceptually the same as between the modes, with the exception of the polarity of current flow, as will become clearer below. The specification now turns to example switch networks to implement the example first mode and second mode, taking into account the circuits to address the excitation current.

FIG. 5 shows a circuit diagram, and partial block diagram, view of a readout system 100 that comprises a switch network to implement the example modes. In particular, FIG. 5 illustrates (by dashed rectangles) a switch network 500 comprising switch portion 502 and switch portion 504. As will be discussed in greater detail below, the switch network 500 selectively couples to the ports of the Wheatstone bridge sensor 102. The switch portion 504 couples between the Wheatstone bridge sensor 102 and the extraction circuit 401 discussed with respect to FIG. 4. As we shall see, the extraction circuit 401 also acts as an excitation source in some configurations of the switch network 500 (e.g., the second mode of the readout circuit 104). Switch portion 502 couples between the Wheatstone bridge sensor 102 and a second extraction circuit 505.

The extraction circuit 505 comprises a first current source 506, second current source 508, and an error amplifier 510. The first current source 506 couples on one side to the switch portion 502, and on a second side to common or ground 512. The second current source 508 couples on one side to the switch portion 502 and on a second side to the common or ground 512. The output of the error amplifier 510 couples to the first and second current sources 506/508 by way of a control line 514. By way of a control signal created by the error amplifier 510 and applied to the control line 514, the error amplifier 510 controls the total current flow through the current sources 506/508. Within manufacturing tolerances, current flow through each current source 506/508 will be equal for an identically applied control signal, and the sum of the electrical currents through the current sources 506/508 is equal $I_O$ in steady state conditions (as illustrated by the $I_O$ flowing from the power supply connection in FIG. 5).

Still referring to FIG. 5, the control signal created by the error amplifier 510 is generated based on a difference between a first reference voltage (designed "REF1" in the figure) coupled to one input 516 of the error amplifier, and a voltage from a voltage divider created by example resistors 518 and 520. The second input 522 of the error amplifier 510 is coupled between the resistors 518 and 520. The reference voltage REF1 may be set to the mid-point of the operational range of the circuit as discussed above. Operation of the extraction circuit 505 is conceptually the same as extraction circuit 401 (with the exception of the polarity of the electrical current flow of the current sources 506 and 508).

As noted above, the switch network 500 comprises switch portions 502 and 504. Each switch portion is designed and constructed to couple its respective extraction circuit to the Wheatstone bridge sensor 102 to implement the various modes discussed above. Referring now to switch portion 502, in the example system the switch portion 502 comprises switch 530 and switch 532. Switch 530 and 532 are shown functionally, but in operation the switching functionality can be implemented by any electrically controlled device or devices, such as a set of transistors or set of silicon controlled rectifiers. Switch 530 defines a common terminal C, first terminal T1, and second terminal T2. The common terminal C of the switch 530 is electrically coupled to a current source 506, the first terminal T1 of switch 530 is electrically coupled to the third sensor connection 130 and thus the third port 110, and the second terminal T2 of the switch 530 is electrically coupled to the first sensor connection 126 and thus the first port 106. Switch 532 defines a common terminal C, a first terminal T1, and a second terminal T2. The common terminal C of the switch 532 is electrically coupled to current source 508, the first terminal T1 of the switch 532 is electrically coupled to the third sensor connection 130 and thus the third port 110, and the second terminal T2 of the switch 532 is electrically coupled to the second sensor connection 128 and thus the second port 108.

Referring now to switch portion 504, in the example system, the switch portion 504 comprises switch 534 and switch 536. Switch 534 and 536 are shown functionally, but in operation the switching functionality can be implemented by any electrically controlled device or devices. Switch 534 defines a common terminal C, a first terminal T1, and a second terminal T2. The common terminal C of the switch 534 is electrically coupled to current source 400, the first terminal T1 of the switch 534 is electrically coupled to the fourth sensor connection 132 and thus the fourth port 112, and the second terminal T2 of the switch 534 is electrically coupled to the first sensor connection 126 and thus the first port 106. Switch 536 defines a common terminal C, a first terminal T1, and a second terminal T2. The common terminal C of the switch 536 is electrically coupled to current source 402, the first terminal T1 of the switch 536 is electrically coupled to the fourth sensor connection 132 and thus the fourth port 112, and the second terminal T2 of the switch 536 electrically coupled to the second sensor connection 128 and thus the second port 108.

In the example first mode of the readout circuit 104 the current sources 506 and 508 operate in unison as the excitation source 200 (FIG. 2) and are electrically coupled to the third sensor connection 130 and thus third port 110 (by way of switches 530 and 532, the connections shown in solid lines). In the example first mode, the resistors 518 and 520 are shorted at their ends opposite the connection to the second input 522 of the error amplifier 510, and thus the voltage at the input 522 is the voltage on the downstream side of current sources 506/508. Turning now to the extraction circuit 401, current source 400 is electrically coupled to the first sensor connection 126 and thus the first port 106 (by way of switch 534, the connection shown in a solid line), current source 402 is electrically coupled to the second sensor connection 128 and the second port 108 (by way of switch 536, the connection shown in a solid line), and the fourth sensor connection 132 is electrically floated. The example differential amplifier 202 creates the virtual short across the first port 106 and second port 108, and thus the voltage at the input 416 of the amplifier 404 is the voltage at the ports 106/108.

Still referring to FIG. 5, in the example second mode the current sources 400 and 402 operate in unison as the excitation source 300 (FIG. 3) are electrically coupled to the fourth sensor connection 132 and thus the fourth port 112 (by way of switches 534 and 536, the connections shown in dense dashed lines), current source 506 is electrically coupled to the first sensor connection 126 and thus the first port 106 (by switch 530, the connection shown in dense dashed line), current source 508 is electrically coupled to the second sensor connection 128 and thus the second port 108 (by switch 530, the connection shown in dense dashed line), and the third sensor connection 130 is electrically floated. The specification now turns to example systems of reading and digitizing values associated with measuring response of sets of sensor elements of the Wheatstone bridge sensor 102.

The extraction circuits 401 and 505 can be operated in at least two different ways. In the description of the example circuit of FIG. 5, the extraction sources 401 and 505 are described to operate the respective current sources as controlled current sources. That is, example error amplifier 510 is active to control current sources 506/508 to regulate the voltage at node 522 (and, apart from voltage drop in the switches, also node 130) equal to REF1. Example error amplifier 404 also regulates the common mode of nodes 106/108 to voltage REF2. In this example operation, the reference REF1 is different from REF2 so there will be a voltage drop across the measured elements of the bridge. Another way to operate the example circuit of FIG. 5 is in a constant current mode. That is, error amplifier 510 is disabled and current sources 506/508 are set to each provide $I_0/2$ through the switches 530 and 532 to the node 130. Operating in this constant current mode could be executed by switching the control line 514 to a fixed DC level. The $I_0$ current will flow through node 130 and provide a common mode signal through the bridge elements to excite them.

Figure 6:
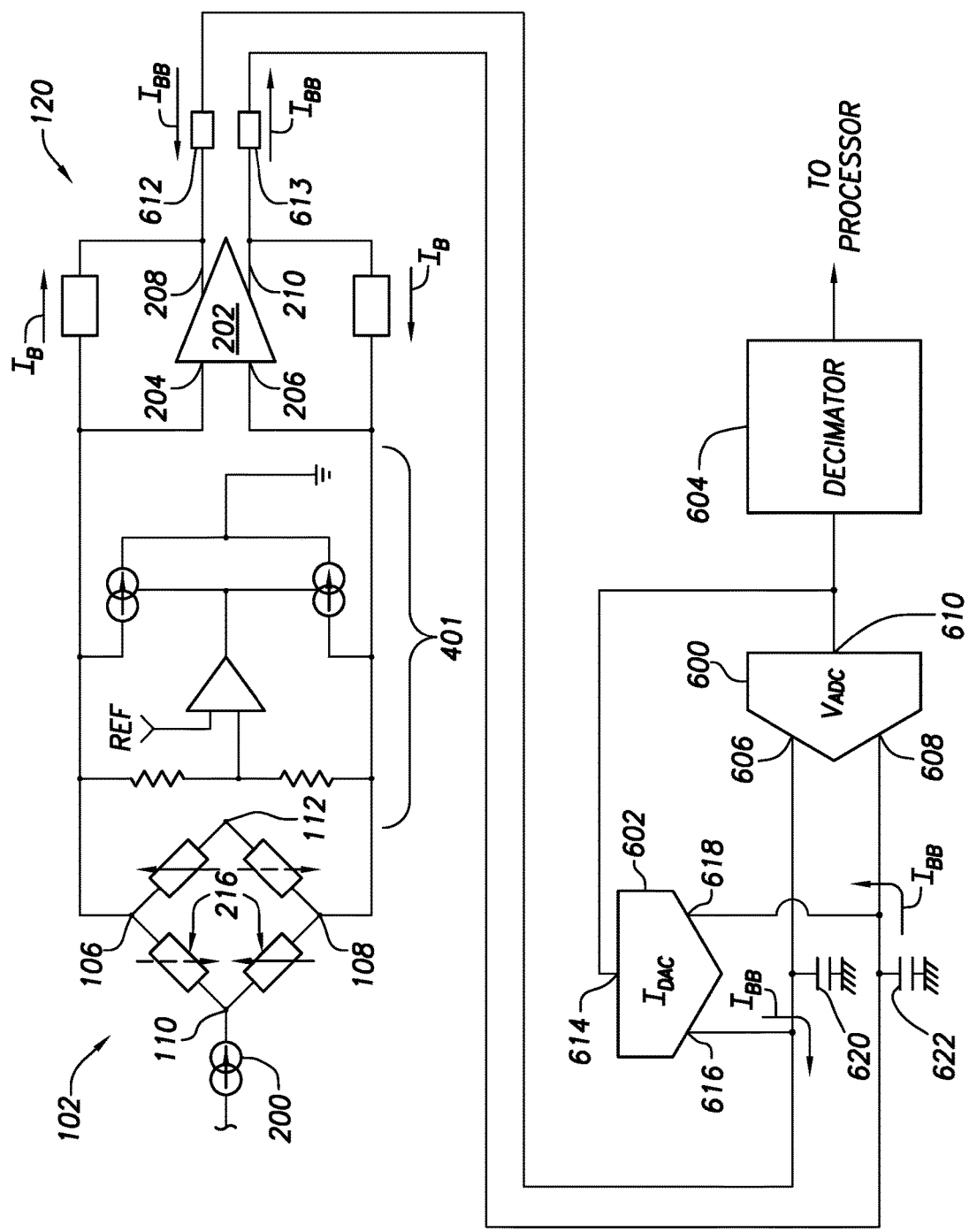
FIG. 6 shows a circuit diagram of a measurement circuit for creating digital representation of a measurement of a set of sensor elements, in accordance with at least some embodiments.

FIG. 6 shows a circuit diagram of a measurement circuit 120 for creating a digital representation of a measurement of a set of sensor elements, in accordance with at least some embodiments. In particular, visible in FIG. 6 is the Wheatstone bridge sensor 102 electrically coupled to the measurement circuit 120. Excitation source 200 (FIG. 2)(which could be the current sources 506 and 508 (FIG. 5) operated in unison) is coupled to the third port 110 of the Wheatstone bridge sensor 102, and the fourth port 112 is electrically floated, and thus the circuit diagram shows the example first mode discussed above. Also visible is the extraction circuit 401, but the individual components of the extraction circuit 401 are not specifically numbered so as not to further complicate the drawing. The first port 106 is electrically coupled to the first differential input 204 of the differential amplifier 202, and the second port 108 is electrically coupled to the second differential input 206 of the differential amplifier 202.

The differential amplifier 202 and various circuits to the right of the differential amplifier 202 in the drawing create a digital representation of the measured response of the set of sensor elements in accordance with at least some embodiments. In particular, the example circuits include a voltage analog-to-digital (A/D) converter 600 ($V_{ADC}$ in the drawing), a current digital-to-analog (D/A) converter 602 ($I_{DAC}$ in the drawing), and a decimator 604. The A/D converter 600 defines a first analog input 606, second analog input 608, and a digital output 610. In the example circuit, the first and second analog inputs 606 and 608 are not two independent analog inputs, but together form a single voltage measurement for conversion. The first analog input 606 is coupled to the first differential output 208 of the differential amplifier 202 by way of an impedance element 612 (e.g., resistor). The second analog input 608 of the A/D converter 600 is coupled to the second differential output 210 of the differential amplifier 202 by way of an impedance element 613 (e.g., resistor). Though not specifically shown in FIG. 6, the analog inputs 606 and 608 may be buffered before they are presented to the core of the ADC converter inside $V_{ADC}$ 600. In accordance with at least some embodiments, the A/D converter 600 may be a single bit (e.g., comparator) or multi-bit A/D converter. For example, the A/D converter 600 may be a plurality of comparators working in parallel (e.g., implemented in a flash architecture) that function as an A/D converter. In such cases, the combination of the A/D converter 600 and the D/A converter 602 (discussed below) together form a first order sigma-delta A/D converter. The description of the circuit of FIG. 6 continues on the assumption that the A/D converter 600 is a single-bit A/D converter, but multi-bit A/D converters may also be used. The digital output 610 is electrically coupled to the decimator 604, which averages over time the values created by the A/D converter 600, and produces a multi-bit output signal (e.g., twelve bit, or sixteen bit) representative of measurements. That is, the decimator 604 is configured to create measurement values based on values read from the digital output 610 of the A/D converter 600.

Still referring to FIG. 6, the D/A converter 602 defines a digital input 614, a first analog output 616, and a second analog output 618. The digital input 614 is electrically coupled to the digital output 610 of the A/D converter 600. The D/A converter 602 may be a single or multi-bit D/A converter or equivalent (e.g., switched current sources operating in parallel). Again however, in such cases combination of the A/D converter 600 and the D/A converter 602 together may form a first order sigma-delta A/D converter. Likewise, if the A/D converter 600 produces a multi-bit output, the D/A converter 614 will be designed and constructed to accept, as a digital input, the multi-bit input signal. In the example circuit, the first and second analog outputs 616 and 618 are not two independent outputs, but work together to drive an analog output current responsive to the digital input signal received on the digital input 614. The first analog output 616 is coupled to the first differential output 208 of the differential amplifier 202, and the second analog output 618 is coupled to the second differential output 210 of the differential amplifier 202. Though not specifically numbered, the feedback loops of differential amplifier 202 have feedback impedance elements (e.g., resistors). Finally, the example circuit comprises two capacitors 620 and 622. The first capacitor 620 couples between the first differential output 208 and ground, and the second capacitor 622 couples between the second differential output 210 and ground.

That is, consider that the differential amplifier 202 is an operational amplifier that creates an output voltage (on the differential outputs 208/210) responsive to voltage differences at the inputs 204/206. It follows that a voltage imbalance across the first port 106 and second port 108 manifests itself as a non-zero current $I_B$ through the feedback impedance elements, thus creating a non-zero voltage across differential outputs 208/210 that acts so as to oppose the voltage imbalance across the first port 106 and second port 108. The amplifier 202, in conjunction with its feedback elements, therefore acts as a trans-impedance amplifier. The current $I_{BB}$, flowing through impedance element 612 and impedance element 613 (e.g., resistor), is then determined by the voltage differences between 208 and 616=606, and between 210 and 618=608, respectively. The ADC loop with $I_{DAC}$ feedback then acts as to nullify the voltage difference (i.e., differential voltage) between 616=606 and 618=608, by counter-injecting the appropriate $I_{BB}$ via the $I_{DAC}$; the ADC loop with $I_{DAC}$ substantially works as a digital nullifier/virtual ground. Though not specifically shown, the analog inputs 606 and 608 may be buffered before they are presented to the core of the ADC converter inside $V_{ADC}$ 600, preventing the finite input impedance of the $V_{ADC}$ to affect the accuracy of the $I_{BB}$ measurement loop. The non-zero current over time creates a voltage difference across the capacitors 620 and 622 (with the capacitors performing a smoothing or integration function). The A/D converter 600 senses the voltage imbalance, and in the example case of a one-bit system, creates a bit stream proportional to the voltage difference across the capacitors 620 and 622. The bit stream may use, for example, pulse-density modulation or pulse-width modulation, and thus the A/D converter 600 is sometimes referred to as a modulator. The D/A converter 602, responsive to the bit stream, creates a current tending to reduce the voltage difference across the capacitors 620 and 622.

Particularly in one-bit systems where the D/A converter 602 has effectively three output currents (i.e., zero, a positive current value, and a negative value), the electrical current provided by the D/A converter 602 will not be precisely the balancing current $I_{BB}$ as a steady-state output signal; rather, the average electrical current provided by the D/A converter 602 will equal the balancing current $I_{BB}$ with the instantaneous current output changing rapidly above and below the steady-state balancing current $I_{BB}$ (including momentary reversals of current flow through the D/A converter 602) keeping in mind that the A/D converter 600 and D/A converter 602 in the form of sigma-delta converters are clocked at multiples of the Nyquist frequency of the measured signal. The average current value produced is the balancing current $I_{BB}$. The decimator 604, in creating a multi-bit value from the pulse stream created by the A/D converter 600, creates a digital representation of the measured response of the set of sensor elements under test. After the first measurement, the switch network 500 (FIG. 5) adjusts with respect to the switches such that the second set of sensor elements may be measured, and a digital representation of the measured response created.

In the example embodiments of FIG. 6, the current produced by the D/A converter 602 is applied directly to the differential outputs 208/210 of the differential amplifier 202 in the form of an operational transconductance amplifier. However, in yet still other embodiments, the current produced by the D/A converter 602 is applied directly to ports of the Wheatstone bridge sensor 102, as discussed below. That is, the embodiments discussed with respect to FIG. 6 have assumed use of an operational transconductance amplifier as the differential amplifier 202, which may be advantageous in certain situations. However, use of an operational transconductance amplifier leads in some situations to use of voltage followers to isolate the current flows, as shown in FIG. 6. In other example cases, the differential amplifier 202 may be a differential amplifier whose output signal is a voltage signal (that is largely independent of the associated current) proportional to the voltage across the differential inputs, as discussed with respect to FIG. 7 below.

Figure 7:
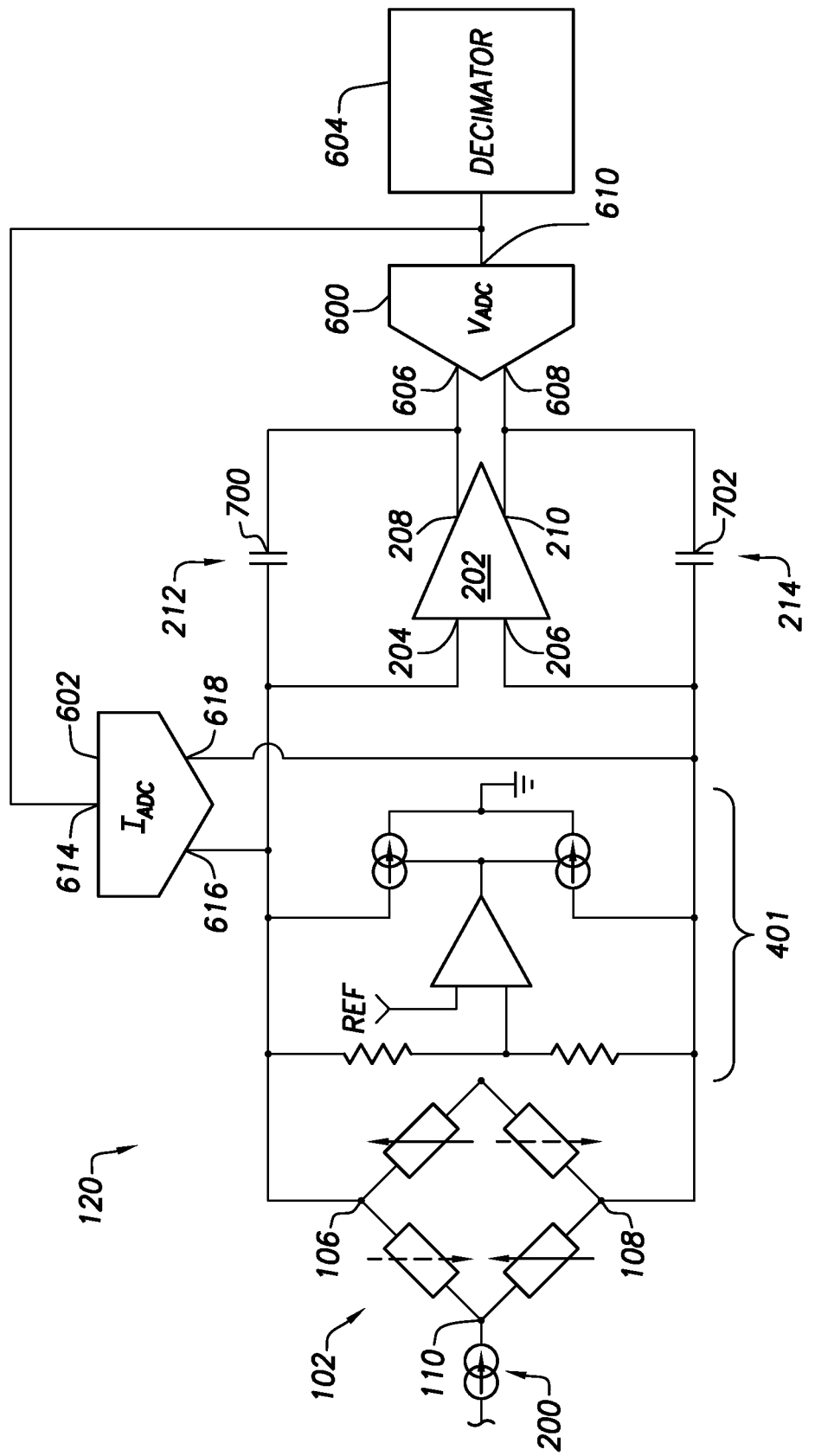
FIG. 7 shows a circuit diagram of a measurement circuit 120 for creating a digital representation of a measurement of a set of sensor elements, in accordance with at least some embodiments.
Figure 8:
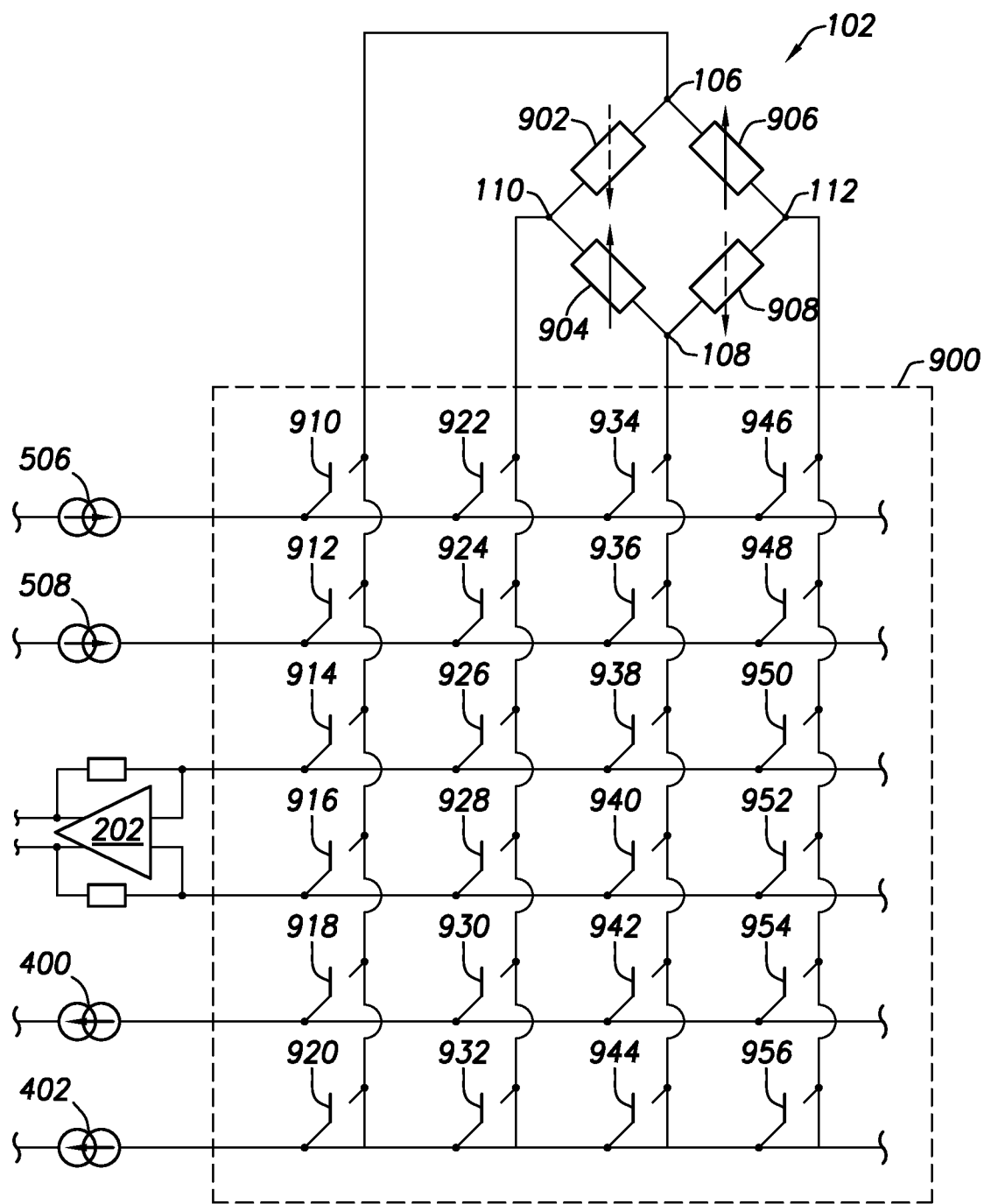
FIG. 8 shows a simplified circuit diagram of a switch network, in accordance with at least some embodiments.

FIG. 7 shows a circuit diagram of a measurement circuit 120 for creating a digital representation of a measurement of a set of sensor elements. In particular, visible in FIG. 8 is the Wheatstone bridge sensor 102 electrically coupled to the measurement circuit 120. Excitation source 200 (which could be the current sources 506 and 508 operated in unison) is coupled to the third port 110 of the Wheatstone bridge sensor 102, and the fourth port 112 is electrically floated, and thus the circuit diagram shows the example first mode discussed above. Also visible is the extraction circuit 401, but the individual components of the extraction circuit 401 are not specifically numbered so as not to further complicate the drawing. The first port 106 is electrically coupled to the first differential input 204 of the differential amplifier 202, and the second port 108 is electrically coupled to the second differential input 206 of the differential amplifier 202.

The example circuit further comprises A/D converter 600 and decimator 604. The first analog input 606 is coupled directly to the first differential output 208 of the differential amplifier 202. The second analog input 608 of the A/D converter 600 is coupled directly to the second differential output 210 of the differential amplifier 202. In accordance with at least some embodiments, the A/D converter 600 is a sigma-delta A/D converter in the variants discussed above. The digital output 610 is electrically coupled to the decimator 604 that is configured to create measurement values based on values read from the digital output 610 of the A/D converter 600.

The D/A converter 602 again defines a digital input 614, the first analog output 616, and the second analog output 618, with the digital input 614 electrically coupled to the digital output 610 of the A/D converter 600. In the example circuit of FIG. 7 the first analog output 616 is coupled directly to the first port 106, and the second analog output 618 is coupled directly to the second port 108 of the Wheatstone bridge sensor 102. In the example system, the feedback elements 212 and 214 are implemented as capacitor 700 and capacitor 702, respectively. The capacitors 700/702 serve at least two functions. First, the capacitors 700/702 force the balancing current to flow to/from the Wheatstone bridge sensor 102. Secondly, the capacitors 700 and 702 in the feedback paths cause the differential amplifier 202 to act as an integrator—creating an output voltage signal across the differential outputs 208/210 proportional to the integral of the voltage presented at the differential inputs 204/206.

In the example embodiments of FIG. 7, controlling voltage across the first port 106 and second port 108 (e.g., creating the virtual short) involves creating and driving the balancing current directly to the first and second ports 106 and 108 by way of the D/A converter 602. That is, considering that the differential amplifier 202 is type of differential amplifier that creates an output voltage proportional to the integral of the voltage difference over time at the differential inputs 204/206, it follows that a voltage imbalance across the first port 106 and second port 108 manifests itself as a non-zero voltage at the differential outputs 208/210. The A/D converter 600 senses the voltage, and in the example case of a one-bit system creates a bit stream proportional to the voltage at the differential outputs 208/210. The D/A converter 602, responsive to the bit stream, creates a current tending reduce the voltage difference across the first port 106 and 108, and thus reduce the voltage generated at the differential outputs 208/210.

Particularly in one-bit systems, the electrical current provided by the D/A converter 602 in the example circuit of FIG. 7 will not be precisely the balancing current $I_B$ as a steady-state output signal; rather, the average electrical current provided by the D/A converter 602 will equal the balancing current $I_B$ with the instantaneous current output changing rapidly above and below the steady-state balancing current $I_B$ (including momentary reversals of current flow through the D/A converter 602). Again, decimator 604, in creating a multi-bit value from the pulse stream created by the A/D converter 600, creates a digital representation of the measured response of the set of sensor elements under test. After the first measurement, the switch network 500 (FIG. 5) adjusts its respective switches such that the second set of sensor elements may be measured, and a digital representation of the measured response created.

The various embodiments to this point have assumed that the readout circuit 104 has two modes—a first mode where the first set of sensor elements are measured, and a second mode where the second set of sensor elements are measured. In yet still other example embodiments, any two contiguous sensor elements of the Wheatstone bridge sensor 102 may be measured, which may be beneficial in localizing faults within the Wheatstone bridge sensor 102.

FIG. 8 shows a simplified circuit diagram of a switch network in accordance with at least some embodiments. In particular, FIG. 8 shows a switch network 900. The current sources 506, 508, 400 and 402, as previously discussed, couple to the switch network 900. To exemplify taking measurements, also shown coupled to the switch network 900 is the differential amplifier 202 and related feedback paths; however, it will be understood that the differential amplifier 202 represents any of the various circuits for taking measurements of sets of sensor elements previously discussed.

FIG. 8 further shows Wheatstone bridge sensor 102 having its four ports 106, 108, 110 and 112 coupled to the switch network 900. For purposes of discussing the example connections to the Wheatstone bridge sensor 102, the four sensor elements are of the Wheatstone bridge sensor 102 are designated 902, 904, 906, and 908. Within the example switch network 900 are twenty four separately controlled electrical switches number 910 through 956. While shown as mechanical switches to avoid further complicating the drawing, each switch is an electrically controlled switch (e.g., transistors) operating under command of the processor 122 (FIG. 1).

As an example, consider the switch network 900 set up to create the first mode as discussed with respect to FIG. 2. Thus, switches 922 and 924 close to couple the controlled current sources 506 and 508 (acting as the excitation source 200) to the third port 110, switches 914 and 940 close to couple the first port 106 and second port 108 to the differential amplifier 202, switches 918 and 944 close to implement the extraction circuit 401, and all others switches are open. Thus, in the first mode the set of sensor elements are sensor elements 902 and 904, and the port 112 between sensor elements 906 and 908 is electrically floated.

Similarly for the second mode as discussed with respect to FIG. 3, switches 954 and 956 close to couple the controlled current sources 400 and 402 (acting as the excitation source 300) to the fourth port 112, switches 914 and 940 close to couple the first port 106 and second port 108 to the differential amplifier 202, switches 910 and 936 close to implement the extraction circuit 505, and all others switches are open. Thus, in the second mode the set of sensor elements are sensor elements 906 and 908, and the port 110 between sensor elements 902 and 904 is electrically floated.

Switch network 900 however enables isolating any two contiguous sensor elements to be the set of sensor elements measured. Thus, consider a third mode in which switches 910 and 912 close to couple the controlled current sources 506 and 508 (acting as the excitation source) to the first port 106, switches 926 and 952 close to couple the third port 110 and fourth port 112 to the differential amplifier 202, switches 930 and 956 close to implement the extraction circuit, and all others switches are open. Thus, in the example third mode, the set of sensor elements are sensor elements 902 and 906, and the port 108 between sensor elements 904 and 908 is electrically floated.

Now consider a fourth mode in which switches 942 and 944 close to couple the controlled current sources 506 and 508 (acting as the excitation source) to the second port 108, switches 926 and 952 close to couple the third port 110 and fourth port 112 to the differential amplifier 202, switches 922 and 948 close to implement the extraction circuit, and all others switches are open. Thus, in the example fourth mode, the set of sensor elements are sensor elements 904 and 908, and the port 106 between sensor elements 902 and 906 is electrically floated.

By taking four measurements (each measurement of a set of sensor elements), the processor 122 (or downstream devices provided the measurements) may not only be able to determine the measured parameter (e.g., pressure, temperature), but also may be able to isolate faults to a particular sensor element. A few additional points before proceeding. Now understanding operation of the switch network 900, it will be understood that switch network 500 (enabling the example first and second modes) is subsumed in the switch network 900. Further, because the polarity of the connections to the differential amplifier are not changed between corresponding measurements (e.g., between the example first and second modes), several switches in the switch network 900 associated with the differential inputs of the differential amplifier 202 were not specifically discussed as being involved in a mode (i.e., switches 916, 928, 930, and 950), and thus in some cases the switches may be omitted. However, it may be advantageous in some situations to reverse the polarity of the connection for measurement purposes, and the presence of all the switches is contemplated. Similarly, because of excitation current polarity (and corresponding extraction circuit polarity), several switches in the switch network 900 associated with the current sources were not described as being involved in a mode (i.e., switch 946 (associated with current source 506), and switches 920, 932, and 942 (associated with controlled current sources 400/402)), and thus in some cases the switches may be omitted. However, it may be advantageous in some situations to reverse the polarity of the excitation sources and/or extraction circuits, and thus again the presence of all the switches is contemplated.

Figure 9:
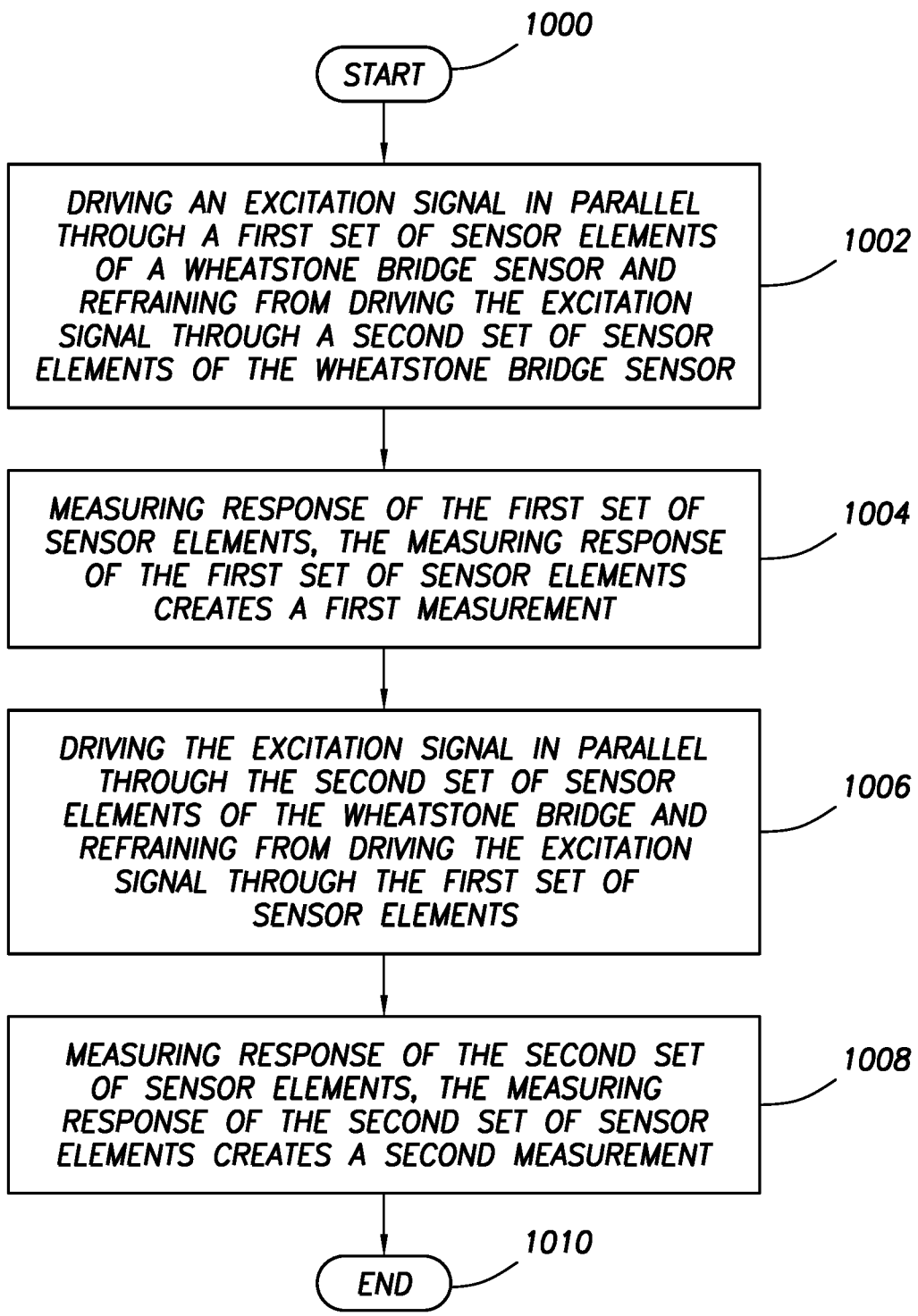
FIG. 9 shows a method in accordance with at least some embodiments.

FIG. 9 shows a method in accordance with at least some embodiments. In particular, the method starts (block 1000) and comprises: driving an excitation signal in parallel through a first set of sensor elements of a Wheatstone bridge sensor and refraining from driving the excitation signal through a second set of sensor elements of the Wheatstone bridge sensor (block 1002); measuring response of the first set of sensor elements, the measuring response of the first set of sensor elements creates a first measurement (block 1004); and driving the excitation signal in parallel through the second set of sensor elements of the Wheatstone bridge and refraining from driving the excitation signal through the first set of sensor elements (block 1006); and measuring response of the second set of sensor elements, the measuring response of the second set of sensor elements creates a second measurement (block 1008). Thereafter the methods ends (block 1010), likely to be immediately restarted.

The above discussion is meant to be illustrative of the principles and various embodiments of the present invention. Numerous variations and modifications will become apparent to those skilled in the art once the above disclosure is fully appreciated. For example, in FIG. 4 the second input 416 is provided by a resistor network; however, in other cases the common-mode voltage may be extracted by tapping the node between the set of sensor elements not used (i.e., floated) for the particular measurement. Moreover, while the various embodiments show the feedback connection to the digital input 614 to source between the $V_{ADC}$ 600 and the decimator 604, in other example embodiments the connection to the digital input 614 may be coupled downstream of the decimator 604 (i.e., after decimation) depending on the expected signal bandwidth and feedback loop stabilization choices. It is intended that the following claims be interpreted to embrace all such variations and modifications.

What is claimed is:

1. A method comprising:
driving a first excitation signal to a first port defined between a first sensor element and a second sensor element of a Wheatstone bridge sensor, and refraining from driving the first excitation signal to a second port defined between a third sensor element and a fourth sensor element of the Wheatstone bridge sensor;
measuring response of the first and second sensor elements, the measuring response of the first and second sensor elements creates a first measurement; and then
driving a second excitation signal to the second port of the Wheatstone bridge sensor and refraining from driving the second excitation signal to the first port; and
measuring response of the third and fourth sensor elements, the measuring response of the third and fourth sensor elements creates a second measurement.

2. A method comprising:
driving a first electrical current to a first port of a Wheatstone bridge sensor, and electrically floating a second port of the Wheatstone bridge sensor, first port defined between a first set of sensor elements of the Wheatstone bridge sensor and the second port defined between a second set of sensor elements of the Wheatstone bridge sensor;
measuring response of the first set of sensor elements, the measuring response of the first set of sensor elements creates a first measurement; and then
driving a second electrical current to the second port of the Wheatstone bridge sensor, and electrically floating the first port of the Wheatstone bridge sensor; and
measuring response of the second set of sensor elements, the measuring response of the second set of sensor elements creates a second measurement.

3. The method of claim 2 further comprising detecting failure of a sensor element of the first set of sensor elements based on the first measurement and the second measurement.

4. The method of claim 2:
wherein measuring response of the first set of sensor elements further comprises measuring a first analog signal across a third port and a fourth port of the Wheatstone bridge sensor; and wherein measuring response of the second set of sensor elements further comprises measuring a second analog signal across the third port and the fourth port of the Wheatstone bridge sensor.

5. The method of claim 4 wherein measuring response of the first set of sensor elements further comprises:
controlling voltage across the third port and the fourth port such that the voltage across the third port and fourth port is substantially zero, the controlling by applying a balancing current to the third port and fourth port; and
determining the first measurement based on the balancing current.

6. The method of claim 5 wherein measuring response of the third and fourth sensor elements further comprises:
controlling voltage across the third port and fourth port such that the voltage across the third port and fourth port is substantially zero, the controlling by applying the balancing current to the third port and fourth port; and
determining the second measurement based on the balancing current.

7. A method comprising:
driving a first excitation signal to a first port defined between a first set of sensor elements of a Wheatstone bridge sensor, and refraining from driving the first excitation signal to a second port defined between a second set of sensor elements of the Wheatstone bridge sensor;
measuring response to the first set of sensor elements to create a first measurement by applying a balancing current to a third port and a fourth port of the Wheatstone bridge sensor, the applying by way of a digital-to-analog (D/A) converter such that a voltage across the third port and the fourth port is substantially zero, the first measurement based on the balancing current; and then
driving a second excitation signal to the second port of the Wheatstone bridge sensor and refraining from driving the second excitation signal to the first port;
measuring response of the second set of sensor elements to create a second measurement; and
creating a digital representation of the first measurement by:
reading, by an analog-to-digital (A/D) converter, an output signal from a differential amplifier electrically coupled to the third and fourth ports of the Wheatstone bridge sensor, the reading creates a digital value;
supplying the digital value to the D/A converter; and
creating the digital representation by averaging the digital value over a predetermined amount of time.

8. The method of claim 7 wherein reading the output signal and supplying the digital value to the D/A converter further comprises reading and supplying by way of a one-bit Sigma-delta A/D modulator.

9. The method of claim 7 wherein applying the balancing current further comprises applying the balancing current directly to the third port and fourth port of the Wheatstone bridge sensor.

10. The method of claim 7 wherein applying the balancing current further comprises applying the balancing current directly to differential outputs of the differential amplifier whose inverting and non-inverting inputs are coupled to the first and second ports of the Wheatstone bridge sensor.

11. A sensor circuit comprising:
a first, second, third, and fourth sensor connections, the first, second, third, and fourth sensor connections configured to couple to a first, second, third, and fourth ports of a Wheatstone bridge sensor;
a switch network coupled to the third and fourth sensor connections, in a first mode the switch network couples a first current source to the third sensor connection and electrically floats the fourth sensor connection, and in a second mode couples a second current source to the fourth sensor connection and electrically floats the third sensor connection;
a differential amplifier that defines a first differential input, a second differential input, and a differential output, the first and second sensor connections electrically coupled to the first and second differential inputs, respectively;
an analog-to-digital (A/D) converter that defines an analog input and a digital output, the analog input electrically coupled to the differential output of the differential amplifier;
a digital-to-analog (D/A) converter that defines a digital input and an analog output, the digital input electrically coupled to the digital output of the A/D converter, and the analog output coupled to the first and second sensor connections;
a decimator coupled to the digital output of the A/D converter, the decimator configured to create measurement values based on values read from the digital output of the A/D converter; and
wherein, in the first mode the sensor circuit is configured to make a first measurement of a first set of sensors in the Wheatstone bridge sensor, and in the second mode the sensor circuit is configured to make a second measurement of a second set of sensors in the Wheatstone bridge sensor.

12. The sensor circuit of claim 11 wherein the switch network further comprises:
a first electrical switch that defines a common terminal, a first terminal, and a second terminal, the common terminal coupled to the first current source, and the first terminal coupled to the third sensor connection, in the first mode the first electrical switch couples the third sensor connection to the first current source and the switch network electrically floats the fourth sensor connection;
a second electrical switch that defines a common terminal, a first terminal, and a second terminal, the common terminal of the second electrical switch coupled to the second current source, and the first terminal of the second electrical switch coupled to the fourth sensor connection, in the second mode the switch network electrically floats the third sensor connection and the second switch couples the second current source to the fourth sensor connection.

13. The sensor circuit of claim 12:
wherein the differential amplifier further comprises an operational transconductance amplifier (OTA); and
wherein the analog output of the D/A converter is directly coupled to the differential output.

14. The sensor circuit of claim 12:
wherein the differential amplifier further comprises an operational transconductance amplifier (OTA); and
wherein the analog output of the D/A converter further comprises first analog output and a second analog output, the first analog output is directly coupled to the first differential input and the second analog output is directly coupled to the second differential input.

15. The sensor circuit of claim 12:
wherein the differential output further comprises a first and second differential outputs;
a first capacitor coupled between the first differential output and the first differential input;
a second capacitor coupled between the second differential output and the second differential input;
wherein the analog output of the D/A converter is directly coupled to the first and second differential inputs.

16. The sensor circuit of claim 12 wherein the A/D converter is a sigma-delta A/D converter.

17. The sensor circuit of claim 16 wherein the sigma-delta A/D converter is a one-bit sigma-delta A/D converter.

18. The sensor circuit of claim 11 wherein the switch network further comprises:
a first switch that defines a common terminal, a first terminal, and a second terminal, the common terminal of the first switch electrically coupled to the first current source, the first terminal of the first switch electrically coupled to the third sensor connection, and the second terminal of the first switch electrically coupled to the first sensor connection;
a second switch that defines a common terminal, a first terminal, and a second terminal, the common terminal of the second switch electrically coupled to a third current source, the first terminal of the second switch electrically coupled to the third sensor connection, and the second terminal of the second switch electrically coupled to the second sensor connection;
a third switch that defines a common terminal, a first terminal, and a second terminal, the common terminal of the third switch electrically coupled to the second current source, the first terminal of the third switch electrically coupled to the fourth sensor connection, and the second terminal of the third switch electrically coupled to the first sensor connection;
a fourth switch that defines a common terminal, a first terminal, and a second terminal, the common terminal of the fourth switch electrically coupled to a fourth current source, the first terminal of the second switch electrically coupled to the fourth sensor connection, and the second terminal of the fourth switch electrically coupled to the second sensor connection;
wherein the first mode the first and third current sources are electrically coupled to the third sensor connection, the second current source is electrically coupled to the first sensor connection, the fourth current source is electrically coupled to the second sensor connection, and the fourth sensor connection is electrically floated; and
wherein the second mode the second and fourth current sources are electrically coupled to the fourth sensor connection, the first current source is electrically coupled to the first sensor connection, the third current source is electrically coupled to the second sensor connection, and the third sensor connection is electrically floated.

19. The sensor circuit of claim 18 further comprising the analog output of the D/A converter further comprises first analog output and a second analog output, the first analog output is directly coupled to the first sensor connection and the second analog output is directly coupled to the second sensor connection.

20. The sensor circuit of claim 11 further comprises the Wheatstone bridge sensor, the first, second, third, and fourth ports of the Wheatstone bridge sensor coupled to the first, second, third and fourth sensor connections, respectively.

* * * * *